United States Patent
Hasegawa et al.

(10) Patent No.: US 9,633,699 B2
(45) Date of Patent: Apr. 25, 2017

(54) DATA STORAGE CONTROL DEVICE

(71) Applicant: DENSO CORPORATION, Kariya, Aichi-pref. (JP)

(72) Inventors: Takaomi Hasegawa, Kariya (JP); Satoshi Watanabe, Kariya (JP); Hiroki Hayashi, Kariya (JP); Hiroki Nawa, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/029,170

(22) PCT Filed: Oct. 8, 2014

(86) PCT No.: PCT/JP2014/005116
§ 371 (c)(1),
(2) Date: Apr. 13, 2016

(87) PCT Pub. No.: WO2015/056425
PCT Pub. Date: Apr. 23, 2015

(65) Prior Publication Data
US 2016/0240229 A1    Aug. 18, 2016

(30) Foreign Application Priority Data
Oct. 18, 2013  (JP) ................................. 2013-217394

(51) Int. Cl.
*G11C 5/14* (2006.01)
*G06F 12/16* (2006.01)
(Continued)

(52) U.S. Cl.
CPC .............. *G11C 5/147* (2013.01); *G06F 1/305* (2013.01); *G06F 12/16* (2013.01); *H02J 1/00* (2013.01); *H02J 7/00* (2013.01); *H02J 7/16* (2013.01)

(58) Field of Classification Search
CPC .. Y02T 10/7005; Y02T 10/7077; B60R 16/03
(Continued)

(56) References Cited

U.S. PATENT DOCUMENTS

2011/0057509 A1* 3/2011 Tsuji ................... B60R 11/0235
307/9.1

FOREIGN PATENT DOCUMENTS

| JP | H08249244 A | 9/1996 |
| JP | 2007-322282 A | 12/2007 |
| JP | 2011204026 A | 10/2011 |

* cited by examiner

*Primary Examiner* — Jason Lappas
(74) *Attorney, Agent, or Firm* — Harness, Dickey & Pierce, P.L.C.

(57) ABSTRACT

A data storage control device controls a memory card which, including a non-volatile rewritable memory, operates using an external power supply. A DC/DC converter generates, by having a power supply of a +B voltage, a card operating voltage for operating the memory card. When delayed ACC is completed after an accessory power supply of a vehicle is turned off, a main microcomputer, a shutdown signal control unit, and a transistor set a shutdown terminal of the DC/DC converter to a low level by setting a main control signal input terminal to a high level and, thereby, stops operation of the DC/DC converter. This inhibits the occurrence of a case in which, after the accessory power supply of the vehicle is turned off, the circuit supplying power to the memory card affects other devices mounted in the vehicle.

1 Claim, 7 Drawing Sheets

(51) Int. Cl.
*H02J 1/00* (2006.01)
*H02J 7/00* (2006.01)
*G06F 1/30* (2006.01)
*H02J 7/16* (2006.01)

(58) Field of Classification Search
USPC .............................. 365/226; 307/9.1; 235/33
See application file for complete search history.

DATA STORAGE CONTROL DEVICE

CROSS REFERENCE TO RELATED APPLICATIONS

This application is a U.S. National Phase Application under 35 U.S.C. 371 of International Application No. PCT/JP 2014/005116 filed on Oct. 8, 2014 and published in Japanese as WO 2015/056425 A1 on Apr. 23, 2015. This application is based on and claims the benefit of priority from Japanese Patent Application No. 2013-217394 filed on Oct. 18, 2013. The entire disclosures of all of the above applications are incorporated herein by reference.

TECHNICAL FIELD

The present disclosure relates to a data storage control device to store data in a memory card.

BACKGROUND ART

When, while a memory card mounted with a non-volatile rewritable memory is being accessed (for data read, data write or data deletion), the power supply for the memory card is suddenly interrupted, the data already stored in the memory card may also be destroyed. Such data destruction in a memory card may possibly occur also when the memory card is not being accessed by any user depending on control by a controller included in the memory card. A technique for inhibiting such data destruction in a memory card has been known in which a large-capacity capacitor (hereinafter referred to as a "backup capacitor") is provided for use as a backup power supply in case the power supply is interrupted (see, for example, patent literature 1).

With a backup capacitor provided, even when the power supply for a memory card is interrupted, the memory card can be kept powered for a period of time corresponding to the amount of electric charge stored in the backup capacitor. By having a normal termination process executed by the memory card itself while the memory card is powered by the backup capacitor, the data stored in the memory card can be prevented from being destroyed.

PRIOR ART LITERATURE

Patent Literature

[Patent Literature 1] JP H08-249244 A

SUMMARY OF INVENTION

Generally, a memory card mounted in a vehicle is supplied with power from a memory card power supply circuit. The memory card power supply circuit generates a card operating voltage for operating the memory card by having power supplied from a vehicle-mounted battery.

However, since the memory card power supply circuit operates at 1 MHz, a frequency equaling a multiple of 1 MHz may interfere with a keyless entry system. For example, a drawback may occur such that a driver of a vehicle cannot lock the doors of the vehicle when he/she is going to leave the vehicle after turning off the accessory power supply of the vehicle.

The present disclosure has been made in view of such a drawback, and it is an object of the present disclosure to provide a data storage control device which can restrict, after an accessory power supply of a vehicle is turned off, a power supply circuit for a memory card from affecting other devices mounted in the vehicle.

According to an aspect of the present disclosure, a data storage control device controls a memory card which, including a non-volatile rewritable memory, operates using an external power supply. The data storage control device includes an operation voltage generation circuit and an operation stopping unit.

The operation voltage generation circuit generates a card operating voltage for operating the memory card by having power supplied from a vehicle-mounted battery. The operation stopping unit stops operation of the operating voltage generation circuit when a preset power supply stopping condition is met after an accessory power supply of the vehicle is turned off, the preset power supply stopping condition allowing, when met, the power supply to the memory card to be stopped.

In the data storage control device configured as described above, when a power supply stopping condition is met, the operation voltage generation circuit supplying power to the memory card stops operating, the power supply stopping condition allowing, when met, the power supply to the memory card to be stopped after an accessory power supply of the vehicle is turned off.

In this way, after the accessory power supply of a vehicle is turned off, other devices mounted in the vehicle can avoid being affected by operation of the operating voltage generation circuit.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

An embodiment of the present disclosure will be described below with reference to the drawings.

Figure 1:
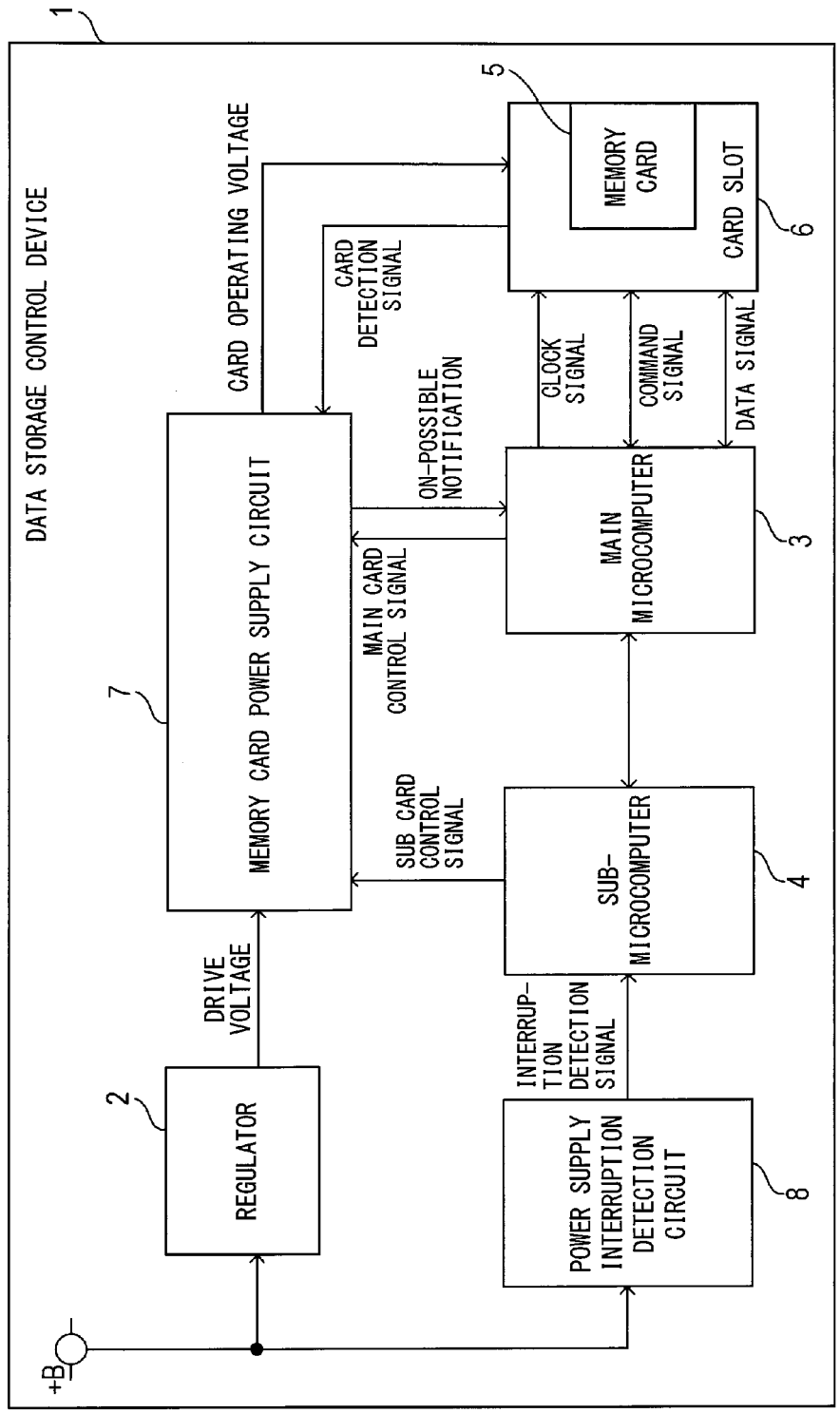
FIG. 1 is a block diagram showing a configuration of a data storage control device 1 according to an embodiment of the present disclosure.

A data storage control device 1 according to the present disclosure is for mounting in a vehicle and includes, as shown in FIG. 1, a regulator 2, a main microcomputer 3, a sub-microcomputer 4, a memory card 5, a card slot 6, a memory card power supply circuit 7, and a power supply interruption detection circuit 8.

The regulator 2 receives a supply voltage from a battery (not shown) mounted in the vehicle via a main relay (not shown), generates, from the supply voltage, drive voltages (e.g., 5 V, 3.3 V, etc. in the present embodiment) required to operate the data storage control device 1, and outputs the drive voltages. The voltage supplied from the battery to the data storage control device 1 via the main relay will hereinafter be referred to as "+B voltage."

The main microcomputer 3 executes various processing to control a control target (the memory card 5 in the present embodiment). The sub-microcomputer 4 executes various processing to control a control target (the regulator 2 in the present embodiment). The main microcomputer 3 and the sub-microcomputer 4 are coupled to each other to be able to communicate data between them.

The memory card 5 includes a card body shaped like a rectangular plate, a non-volatile rewritable memory, and a card controller to control data writing/reading to/from the non-volatile memory. Namely, the memory card 5 is configured with the non-volatile memory and the card controller included in the card body. In the present embodiment, the memory card 5 is an SD card (registered trademark).

The card slot 6 includes a card coupling part to which the memory card 5 can be decouplably coupled. The card slot 6 further includes a power supply terminal, a clock terminal, a command terminal, a data terminal, and a card detection terminal.

The power supply terminal is for inputting a voltage for operating the memory card 5 (hereinafter referred to as the "card operating voltage VDD") from the memory card power supply circuit 7.

The clock terminal is for inputting a clock signal for operating the memory card 5 from the main microcomputer 3. The memory card 5 is configured such that, when the input of the clock signal thereto stops, internal processing to avoid data destruction is performed before a backup time (e.g. 250 ms in the present embodiment) elapses from that time.

The command terminal is for inputting/outputting from/to the main microcomputer 3 command signals for controlling the memory card 5. The data terminal is for inputting/outputting from/to the main microcomputer 3 data signals for writing/reading to/from the memory card 5.

The card detection terminal is for outputting a card detection signal indicating whether the memory card 5 is inserted in the card slot 6. The card detection signal in the present embodiment is set to a low level when the memory card 5 is inserted in the card slot 6 and is set to a high level when the memory card 5 is not inserted in the card slot 6.

The memory card power supply circuit 7 receives a drive voltage from the regulator 2, generates, from the drive voltage, the card operating voltage VDD (e.g., 3.3 V in the present embodiment), and outputs the card operating voltage VDD.

The power supply interruption detection circuit 8 receives the +B voltage and detects occurrence of interruption of the +B voltage. When a +B voltage interruption is detected, the power supply interruption detection circuit 8 outputs an interruption detection signal indicating the detection of a +B voltage interruption to the sub-microcomputer 4. In the present embodiment, when the +B voltage drops to or below a preset threshold for interruption detection (e.g., 4.5 V), the power supply interruption detection circuit 8 determines that a +B voltage interruption has occurred.

When the interruption detection signal from the power supply interruption detection circuit 8 is received, the sub-microcomputer 4 forcibly shuts down the main microcomputer 3 by cutting off the power supply for the main microcomputer 3. As a result, the main microcomputer 3 stops outputting the clock signal.

Figure 2:
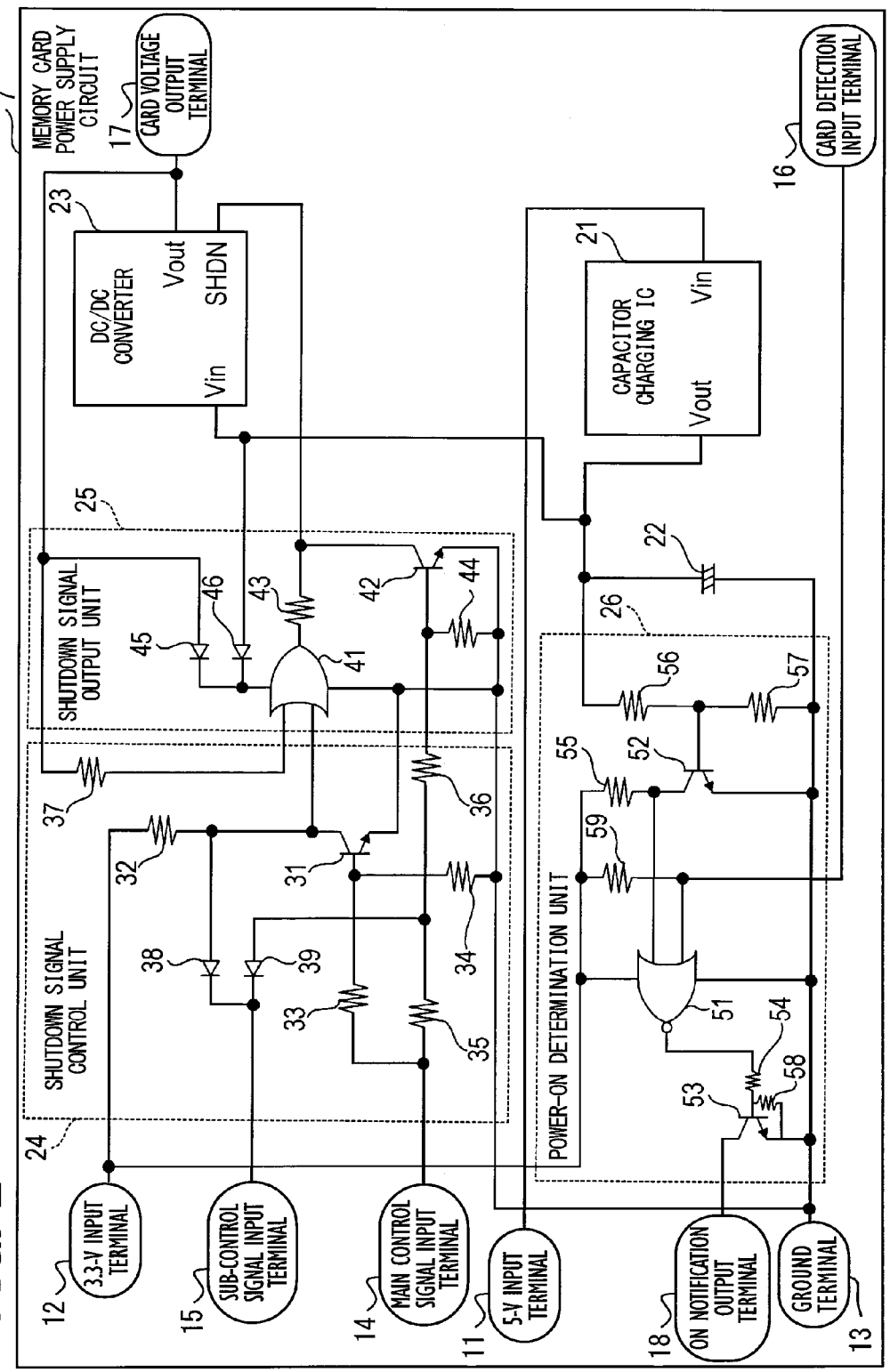
FIG. 2 is a circuit diagram showing a configuration of a memory card power supply circuit 7 of the data storage control device 1.

The memory card power supply circuit 7 includes, as shown in FIG. 2, a 5-V input terminal 11, a 3.3-V input terminal 12, a ground terminal 13, a main control signal input terminal 14, a sub-control signal input terminal 15, a card detection input terminal 16, a card voltage output terminal 17, and an on notification output terminal 18.

The 5-V input terminal 11 receives a 5-V drive voltage from the regulator 2. The 3.3-V input terminal 12 receives a 3.3-V drive voltage from the regulator 2. The ground terminal 13 is coupled to ground.

The main control signal input terminal 14 receives from the main microcomputer 3 main card control signals for controlling the output of the card operating voltage VDD. The sub-control signal input terminal 15 receives from the sub-microcomputer 4 sub card control signals for controlling the output of the card operating voltage VDD. The card detection input terminal 16 receives a card detection signal from the card slot 6.

The memory card power supply circuit 7 includes a capacitor charging IC 21, a backup capacitor 22, a DC/DC converter 23, a shutdown signal control unit 24, a shutdown signal output unit 25, and a power-on determination unit 26.

The capacitor charging IC 21 has a voltage input terminal Vin and a voltage output terminal Vout. The capacitor charging IC 21 receives the 5-V drive voltage via the voltage input terminal Vin, generates from the drive voltage a charging voltage (e.g., 4 V in the present embodiment) for charging the backup capacitor 22, and outputs the charging voltage via the voltage output terminal Vout.

The backup capacitor 22 is a backup power supply for the memory card 5. The backup capacitor 22 has electrostatic capacitance large enough to allow the memory card power supply circuit 7 to supply the card operating voltage VDD continuously at least for a period of the foregoing backup time (e.g., 250 ms in the present embodiment) from a time the supply of the +B voltage is stopped. The positive electrode of the backup capacitor 22 is coupled to the voltage output terminal Vout of the capacitor charging IC 21. The negative electrode of the backup capacitor 22 is grounded.

The DC/DC converter 23 includes a voltage input terminal Vin, a voltage output terminal Vout, and a shutdown terminal SHDN. The DC/DC converter 23 receives a charging voltage from the capacitor charging IC 21 via the voltage input terminal Vin, generates the card operating voltage VDD from the charging voltage, and outputs the card operating voltage VDD via the voltage output terminal Vout. When the shutdown signal inputted to the shutdown terminal SHDN is at a high level, the DC/DC converter 23 outputs the card operating voltage VDD. When the shutdown signal is set to a low level, the DC/DC converter 23 stops the output of the card operating voltage VDD.

The shutdown signal control unit 24 includes a transistor 31, resistors 32, 33, 34, 35, 36, and 37, and diodes 38 and 39.

The transistor 31 is an NPN transistor having a collector, a base, and an emitter. The collector of the transistor 31 is coupled to the 3.3-V input terminal 12 via the resistor 32. The base of the transistor 31 is coupled to the main control signal input terminal 14 via the resistor 33. The emitter of the transistor 31 is coupled to the ground terminal 13. The resistor 34 has one end coupled to the base of the transistor 31 and the other end coupled to ground. The resistors 33 and 34 have resistances such that, when the main card control signal from the main microcomputer 3 is at a high level, the voltage across the resistor 34 resulting from voltage division between the resistors 33 and 34 is higher than the on voltage of the transistor 31.

The resistor 35 has one end coupled to the main control signal input terminal 14 and the other end coupled to one end of the resistor 36. The other end of the resistor 36 is coupled to the shutdown signal output unit 25. The resistor 37 has one end coupled to the voltage output terminal Vout of the DC/DC converter 23 and the other end coupled to the shutdown signal output unit 25.

The diode 38 has an anode coupled to a connection point between the resistor 32 and the transistor 31 and a cathode coupled to the sub-control signal input terminal 15. The diode 39 has an anode coupled to the connection point between the resistor 35 and the resistor 36 and a cathode coupled to the sub-control signal input terminal 15.

The shutdown signal output unit 25 includes an OR circuit 41, a transistor 42, resistors 43 and 44, and diodes 45 and 46.

The OR circuit 41 has a first input terminal, a second input terminal, an output terminal, and a supply voltage terminal. The OR circuit 41 performs logical OR operation between signals inputted to the first input terminal and the second input terminal, respectively, and outputs a signal indicating the result of the logical OR operation via the output terminal. The first input terminal is coupled to the voltage output terminal Vout of the DC/DC converter 23 via the resistor 37 of the shutdown signal control unit 24. The second input terminal is coupled to the collector of the transistor 31 included in the shutdown signal control unit 24. The output terminal is coupled to the shutdown terminal SHDN of the DC/DC converter 23 via the resistor 43.

The transistor 42 is an NPN transistor having a collector, a base, and an emitter. The collector of the transistor 42 is coupled to the shutdown terminal SHDN of the DC/DC converter 23. The base of the transistor 42 is coupled to the main control signal input terminal 14 via the resistors 35 and 36 of the shutdown signal control unit 24. The emitter of the transistor 42 is coupled to the ground terminal 13. The resistor 44 has one end coupled to the base of the transistor 42 and the other end coupled to ground. The resistors 35, 36, and 44 have resistances such that, when the main-side card control signal from the main microcomputer 3 is at a high level, the voltage across the resistor 44 resulting from voltage division between the resistors 35, 36, and 44 is higher than the on voltage of the transistor 42.

The diode 45 has an anode coupled to the voltage output terminal Vout of the DC/DC converter 23 and a cathode coupled to the supply voltage terminal of the OR circuit 41. The diode 46 has an anode coupled to the voltage output terminal Vout of the capacitor charging IC 21 and a cathode coupled to the supply voltage terminal of the OR circuit 41.

The power-on determination unit 26 includes a NOR circuit 51, transistors 52 and 53, and resistors 54, 55, 56, 57, 58, and 59.

The NOR circuit 51 has a first input terminal, a second input terminal, an output terminal, and a supply voltage terminal. The NOR circuit 51 performs logical NOR operation between signals inputted to the first input terminal and the second input terminal, respectively, and outputs a signal indicating the result of the logical NOR operation via the output terminal. The first input terminal is coupled to the collector of the transistor 52. The second input terminal is coupled to the card detection input terminal 16. The output terminal is coupled to the base of the transistor 53 via the resistor 54.

The transistor 52 is an NPN transistor having a collector, a base, and an emitter. The collector of the transistor 52 is coupled to the 3.3-V input terminal 12 via the resistor 55. The base of the transistor 52 is coupled to the voltage output terminal Vout of the capacitor charging IC 21 via the resistor 56. The emitter of the transistor 52 is coupled to the ground terminal 13. The resistor 57 has one end coupled to the base of the transistor 52 and the other end grounded. The resistors 56 and 57 have resistances such that, when the voltage of the backup capacitor 22 is equal to or higher than a backup enabling voltage (e.g., 1.3 V in the present embodiment), the voltage across the resistor 57 resulting from voltage division between the resistors 56 and 57 is higher than the on voltage of the transistor 52. The backup enabling voltage is a voltage which allows the backup capacitor 22 to accumulate an amount of charge corresponding to the backup time.

The transistor 53 is an NPN transistor having a collector, a base, and an emitter. The collector of the transistor 53 is coupled to the on notification output terminal 18 that is coupled to the main microcomputer 3. The transistor 53 is provided to match the input voltage on the main microcomputer 3 side, and the on notification output terminal 18 is required to be pulled up by the input voltage of the microcomputer (not shown). The base of the transistor 53 is coupled to the output terminal of the NOR circuit 51 via the resistor 54. The emitter of the transistor 53 is coupled to the ground terminal 13. The resistor 58 has one end coupled to the base of the transistor 53 and the other end grounded. The resistors 54 and 58 have resistances such that, when the output signal from the NOR circuit 51 is at a high level, the voltage across the resistor 58 resulting from voltage division between the resistors 54 and 58 is higher than the on voltage of the transistor 53.

The resistor 59 has one end coupled to the 3.3-V input terminal 12 and the other end coupled to the card detection input terminal 16.

In the power-on determination unit 26 configured as described above, when the voltage of the backup capacitor 22 rises by being charged, the transistor 52 enters an on state causing the first input terminal of the NOR circuit 51 to be set to a low level. Also, when the card detection input terminal 16 is at a low level, the second input terminal of the NOR circuit 51 is set to a low level.

Namely, when the backup capacitor 22 is charged and the memory card 5 is inserted in the card slot 6, the output terminal of the NOR circuit 51 is at a high level; otherwise the output terminal of the NOR circuit 51 is at a low level.

When the output terminal of the NOR circuit 51 is at a high level, the transistor 53 enters an on state and the on notification output terminal 18 is set to a low level.

In the following, an example operation of the data storage control device 1 configured as described above will be described.

Figure 3:
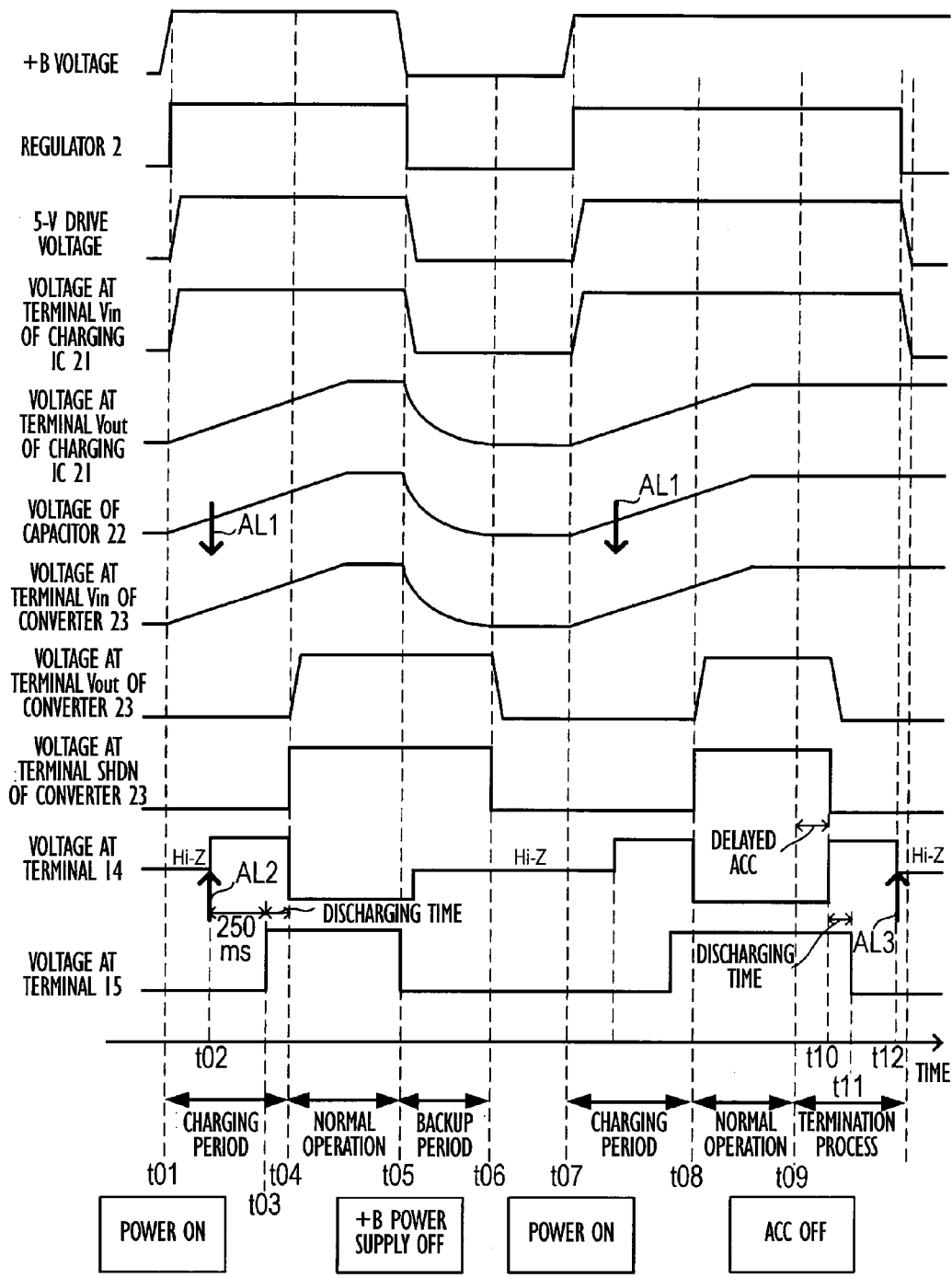
FIG. 3 is a timing chart describing operation of the data storage control device 1.

Referring to FIG. 3, when, at time t01, the data storage control device 1 is powered on (see +B voltage at time t01), the regulator 2 starts operating and outputs the 5-V drive voltage. As a result, the 5-V drive voltage is inputted to the voltage input terminal Vin of the capacitor charging IC 21 causing the capacitor charging IC 21 to start operating. This causes the voltage at the voltage output terminal Vout of the capacitor charging IC 21 to rise to a charging voltage (4 V in the present embodiment). As a result, the voltage of the backup capacitor 22 and the voltage at the input terminal Vin of the DC/DC converter 23 to gradually rise to the charging voltage (4 V).

When the voltage of the backup capacitor 22 reaches the backup enabling voltage (e.g., 1.3 V in the present embodiment), the memory card power supply circuit 7 lowers the voltage at the on notification output terminal 18 to a low level and, thereby, outputs a low-level on-possible notification (see arrow AL1). The main microcomputer 3 is powered on by having the 5-V drive voltage supplied from the regulator 2. Subsequently, in the main microcomputer 3, port setting is completed at time t02 during the initialization process, and the main control signal input terminal 14 is fixed at a logical high level (see arrow AL2). Subsequently, at time t03, the sub-microcomputer 4 sets the sub-control signal input terminal 15 to a high level. It is 250 ms or more after the main microcomputer 3 is powered on that the sub-microcomputer 4 sets the sub-control signal input terminal 15 to a high level. This is to secure a power supply retention time of 250-ms under whatever circumstances. The 250-ms power supply retention becomes necessary, for example, when the clock pulses from the main microcomputer 3 are interrupted as a result of hard-resetting of the main microcomputer 3.

When, at the end of a charging period at time t04, the on notification output terminal 18 is at a low level, the main microcomputer 3 sets the main control signal input terminal 14 to a low level. This causes the shutdown terminal SHDN of the DC/DC converter 23 to be set to a high level and the DC/DC converter 23 to start operating and output the card operating voltage VDD from the voltage output terminal Vout of the DC/DC converter 23. The main microcomputer 3 sets the main control signal input terminal 14 to a low level after a discharging time (e.g., 10 ms in the present embodiment) elapses after the sub-control signal input terminal 15 is set to a high level. The discharging time is a period of time required to securely lower the supply voltage (from the DC/DC converter 23) for the memory card 5. When, at the end of a charging period, the on notification output terminal 18 is at a high level, the main microcomputer 3 does not set the main control signal input terminal 14 to a low level. This inhibits the DC/DC converter 23 from operating, so that the memory card 5 is not powered on.

If, at time t05, the supply of the 5-V drive voltage is stopped, for example, due to an interruption of the +B voltage, power is supplied from the backup capacitor 22 to the DC/DC converter 23. This allows the DC/DC converter 23 to output the card operating voltage VDD from the voltage output terminal Vout for at least 250 ms (see the backup period (time t05 to t06) shown in the diagram).

Subsequently, for example, when the voltage of the backup capacitor 22 drops below the minimum operating voltage required by the DC/DC converter 23 or when the power supply to the OR circuit 41 is stopped causing the shutdown terminal SHDN of the DC/DC converter 23 to be set to a low level, the output of the card operating voltage VDD from the DC/DC converter 23 stops at time t06.

Subsequently, when the +B voltage is restored at time t07, a charging period starts. As a result, the same operation as performed during the charging period of time t01 to t04 is performed during the charging period of time t07 to t08. Next, at time t08, normal operation starts and operation as performed during time t04 and t05 takes place.

Subsequently, when, at time t09, the ACC power supply is turned off, delayed ACC is entered. The delayed ACC is processing executed, after the ACC power supply is turned off, to safely terminate the operation of the main microcomputer 3. When, at time t10, the delayed ACC is completed, the main microcomputer 3 sets the main control signal input terminal 14 to a high level. This sets the shutdown terminal SHDN of the DC/DC converter 23 to a low level, and the output of the card operating voltage VDD from the DC/DC converter 23 is stopped.

At time t11, that is, when the discharging time (e.g., 10 ms in the present embodiment) elapses after the output of the DC/DC converter 23 is stopped, the sub-microcomputer 4 sets the sub-control signal input terminal 15 to a low level. Then, at time t12, the main microcomputer 3 is powered off (see arrow AL3) and the system is shut down.

Next, example operations of the shutdown signal control unit 24 and the shutdown signal output unit 25 will be described.

Figure 4:
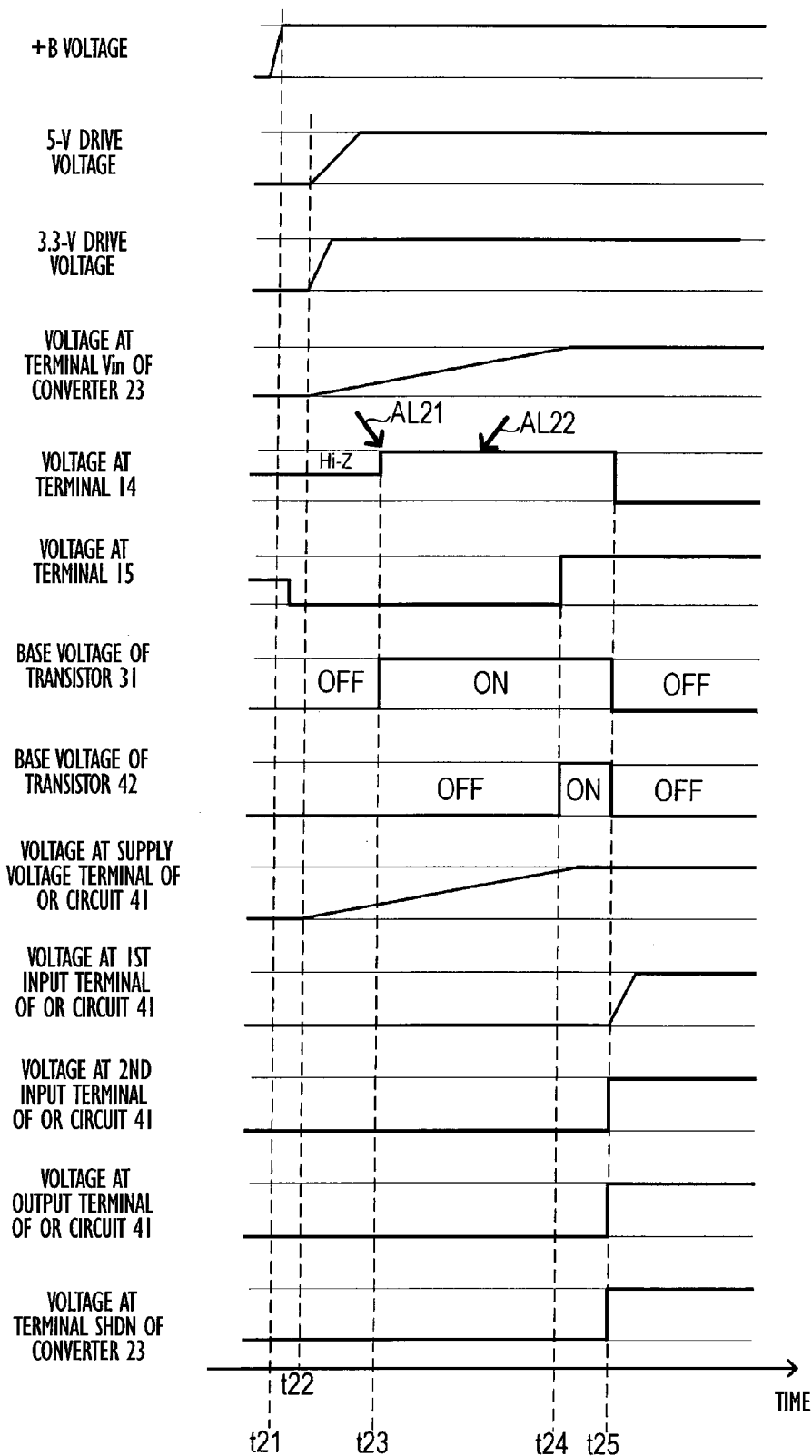
FIG. 4 is a first timing chart describing operations of a shutdown signal control unit 24 and a shutdown signal output unit 25.

FIG. 4 is a timing chart describing the operations of the shutdown signal control unit 24 and the shutdown signal output unit 25 taking place when, with the voltage of the backup capacitor 22 being 0 V, the ACC power supply is turned on.

As shown in FIG. 4, when the ACC power supply is turned on, the +B voltage is inputted to the data storage control device 1 (see the +B voltage at time t21) causing the regulator 2 to start operating and the 5-V and 3.3-V drive voltages to be outputted from the regulator 2 (see the 5-V and 3.3-V drive voltages at time t22). As a result, the 5-V drive voltage is inputted to the voltage input terminal Vin of the capacitor charging IC 21 and the capacitor charging IC 21 starts operating. This causes the voltage of the backup capacitor 22 and the voltage at the voltage input terminal Vin of the DC/DC converter 23 to gradually rise until reaching the charging voltage (4 V).

Subsequently, at time t23, the main microcomputer 3 is powered on (see arrow AL21) and the main control signal input terminal 14 is fixed at a logical high level. As a result, the on voltage is applied to the base of the transistor 31 and the transistor 31 enters an on state. Since the transistor 31 enters an on state while the sub-control signal input terminal 15 is at a low level, the voltage level at the second input terminal of the OR circuit 41 remains low without being affected by turning on of the transistor 31.

Since, at this time, the sub-control signal input terminal 15 is at a low level, the on voltage is not applied to the base of the transistor 42, so that the transistor 42 remains in an off state.

Subsequently, when initialization of the main microcomputer 3 is completed (see arrow AL22), the sub-microcomputer 4 sets, at time t24, the sub-control signal input terminal 15 to a high level. It is 250 ms or more after the main microcomputer 3 is powered on that the sub-microcomputer 4 sets the sub-control signal input terminal 15 to a high level.

Setting the sub-control signal input terminal 15 to a high level causes the on voltage to be applied to the base of the transistor 42 and the transistor 42 to enter an on state.

Next, at time t25, i.e. when the discharging time (10 ms) elapses after the sub-control signal input terminal 15 is set to a high level, the main microcomputer 3 sets the main control signal input terminal 14 to a low level. As a result, the transistor 31 enters an off state, and the second input terminal of the OR circuit 41 is set to a high level. This causes the output terminal of the OR circuit 41 to be set to a high level. Furthermore, as the transistor 42 enters an off state, the shutdown terminal SHDN of the DC/DC converter 23 is set to a high level, and the DC/DC converter 23 starts operating. As a result, the first input terminal of the OR circuit 41 is set to a high level.

Figure 5:
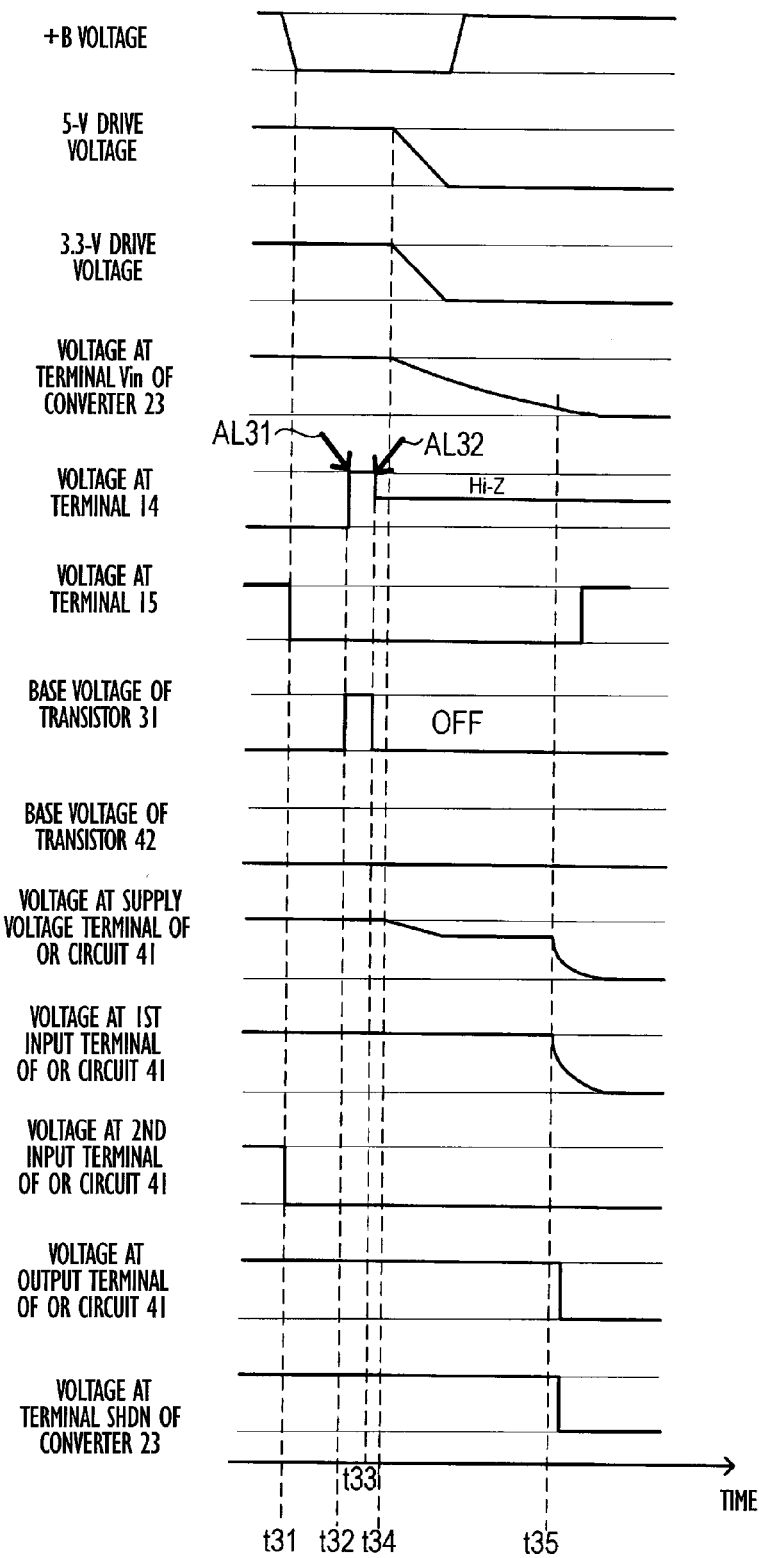
FIG. 5 is a second timing chart describing operations of the shutdown signal control unit 24 and the shutdown signal output unit 25.

FIG. 5 is a timing chart describing the operations of the shutdown signal control unit 24 and the shutdown signal output unit 25 taking place when an interruption of the +B voltage occurs.

As shown in FIG. 5, when an interruption of the +B voltage occurs at t31, the power supply interruption detection circuit 8 outputs an interruption detection signal to the sub-microcomputer 4. When the interruption detection signal is received, the sub-microcomputer 4 sets the sub-control signal input terminal 15 to a low level. As a result, the second input terminal of the OR circuit 41 is set to a low level.

Subsequently, at time t32, the main microcomputer 3 is reset (see arrow AL31) causing the main control signal input terminal 14 to be set to a high level. As a result, the on voltage is applied to the base of the transistor 31 causing the transistor 31 to enter an on state. Furthermore, at time t33, the main microcomputer 3 is powered off (see arrow AL32). This makes the voltage level at the main control signal input terminal 14 indefinite and the transistor 31 enters an off state.

Subsequently, at time t34, the 5-V and 3.3-V drive voltages start lowering. As the 5-V drive voltage lowers, the voltage at the voltage output terminal Vout of the capacitor charging IC 21 lowers. This is followed by lowering of the voltages at the voltage input terminal Vin of the DC/DC converter 23 and the power supply terminal of the OR circuit 41. The supply voltage terminal of the OR circuit 41, however, receives the card operating voltage VDD (3.3 V) from the DC/DC converter 23 via the diode 45. Therefore, the lowering of the voltage at the supply voltage terminal of the OR circuit 41 once stops when the card operating voltage VDD (3.3 V) is reached at the supply voltage terminal, so that the supply voltage terminal of the OR circuit 41 is then held at the card operating voltage VDD (3.3 V).

When, at time t35, the voltage at the voltage input terminal Vin of the DC/DC converter 23 drops below the minimum operating voltage required by the DC/DC converter 23, the output of the card operating voltage VDD from the DC/DC converter 23 is stopped. As a result, the voltages at the first input terminal and the supply voltage terminal of the OR circuit 41 start lowering from the card operating voltage VDD (3.3 V) and reach 0 V at the end of the discharging time of the DC/DC converter 23. As a result, the output terminal of the OR circuit 41 changes from a high level to a low level. Following this, the shutdown terminal SHDN of the DC/DC converter 23 changes from a high level to a low level.

Figure 6:
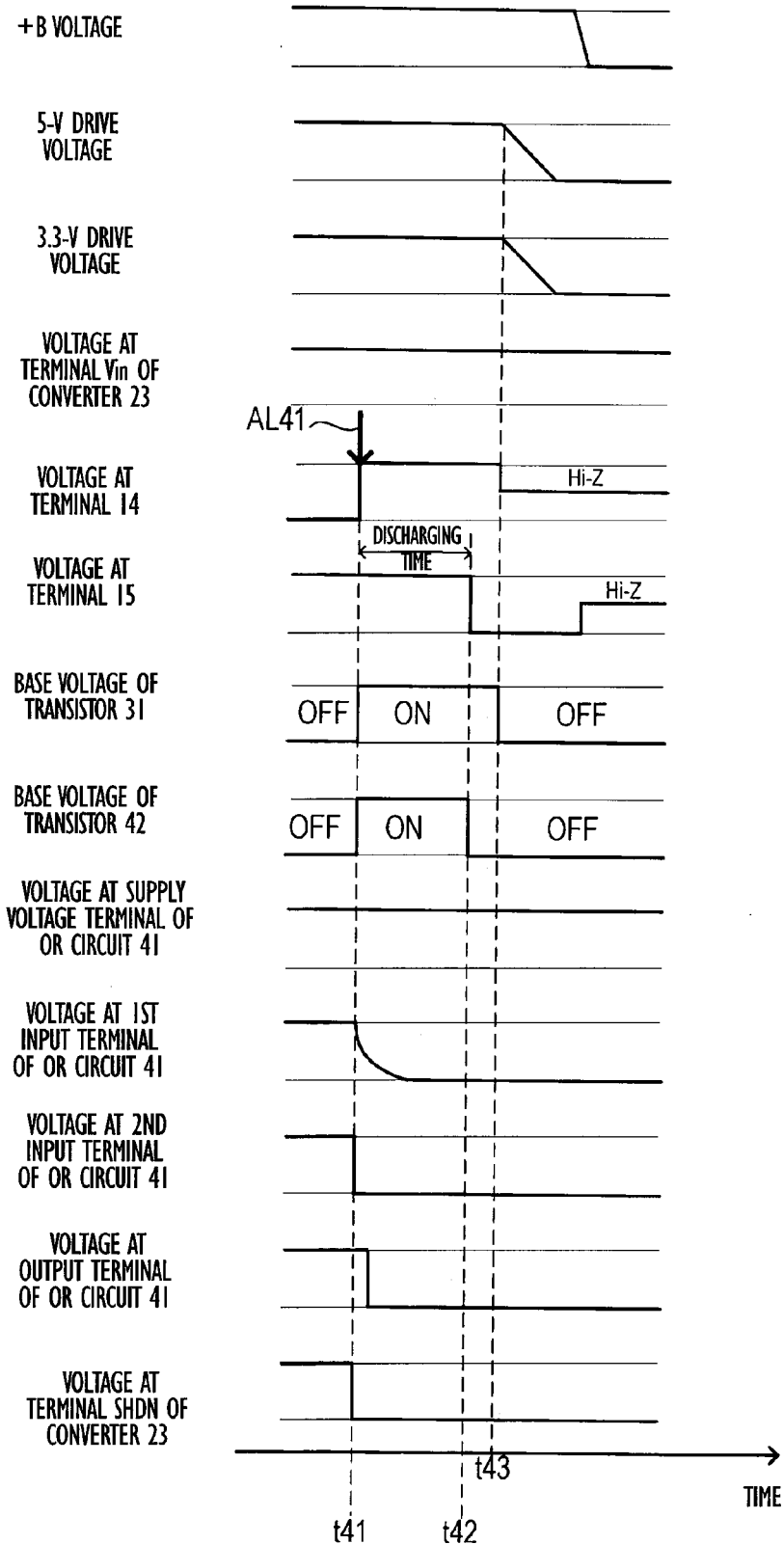
FIG. 6 is a third timing chart describing operations of the shutdown signal control unit 24 and the shutdown signal output unit 25.

FIG. 6 is a timing chart describing the operations of the shutdown signal control unit 24 and the shutdown signal output unit 25 taking place when the ACC power supply is turned off.

When the ACC power supply is turned off, the delayed ACC is entered. As shown in FIG. 6, when, at time t41, the delayed ACC is completed (see arrow AL41), the main microcomputer 3 sets the main control signal input terminal 14 to a high level. When this occurs, the sub-control signal input terminal 15 is at a high level, so that the on voltage is applied to the bases of the transistors 31 and 42 causing the transistors 31 and 42 to enter an on state. As a result, the second input terminal of the OR circuit 41 and the shutdown terminal SHDN of the DC/DC converter 23 change from a high level to a low level. As the shutdown terminal SHDN of the DC/DC converter 23 is set to a low level, the output of the card operating voltage VDD from the DC/DC converter 23 is stopped.

Furthermore, at time t42, i.e. when the discharging time elapses after the output of the DC/DC converter 23 is stopped, the sub-microcomputer 4 sets the sub-control signal input terminal 15 to a low level. Subsequently, at time t43, the main microcomputer 3 is powered off.

Figure 7:
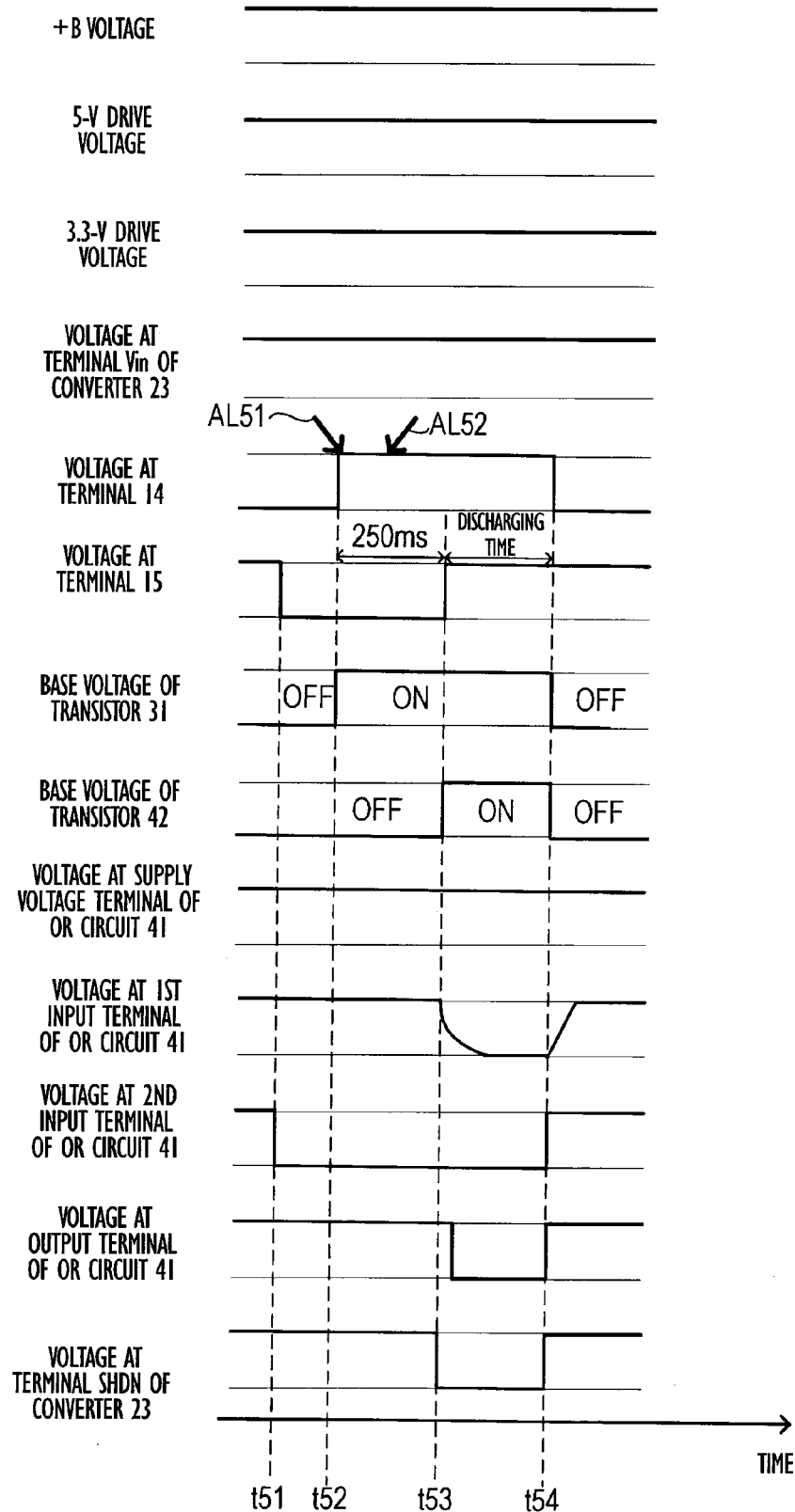
FIG. 7 is a fourth timing chart describing operations of the shutdown signal control unit 24 and the shutdown signal output unit 25.

FIG. 7 is a timing chart describing the operations of the shutdown signal control unit 24 and the shutdown signal output unit 25 taking place when the main microcomputer 3 is reset.

As shown in FIG. 7, at time t51, i.e. before the main microcomputer 3 goes out of control to be consequently reset, the sub-microcomputer 4 changes the sub-control signal input terminal 15 from a high level to a low level. As a result, the second input terminal of the OR circuit 41 changes from a high level to a low level.

Subsequently, at time t52, the main microcomputer 3 is reset (see arrow AL51) causing the main control signal input terminal 14 to be set to a high level. As a result, the transistor 31 enters an on state.

Subsequently, after initialization of the main microcomputer 3 is completed (see arrow AL52), the sub-microcomputer 4 sets the sub-control signal input terminal 15 to a high level at time t53. It is 250 ms or more after the main microcomputer 3 is powered on that the sub-microcomputer 4 sets the sub-control signal input terminal 15 to a high level. As a result, the transistor 42 enters an on state, and the shutdown terminal SHDN of the DC/DC converter 23 changes from a high level to a low level. This causes the output of the card operating voltage VDD from the DC/DC converter 23 to be stopped.

At time t54, i.e. when the discharging time elapses after the sub-control signal input terminal 15 is set to a high level, the main microcomputer 3 sets the main control signal input terminal 14 to a low level. As a result, the transistors 31 and 42 enter an off state. First, entering an off state of the transistor 31 causes the second input terminal of the OR circuit 41 to change from a low level to a high level. As a result, the output terminal of the OR circuit 41 changes from a low level to a high level. Also, entering an off state of the transistor 42 causes the shutdown terminal SHDN of the DC/DC converter 23 to change from a low level to a high level. As a result, the output of the card operating voltage VDD from the DC/DC converter 23 is resumed.

The data storage control device 1 configured as described above controls the memory card 5 that, including a nonvolatile rewritable memory, operates using an external power supply.

First, by having power supplied from the +B voltage, the DC/DC converter 23 generates the card operating voltage VDD for operating the memory card 5. When the delayed ACC is completed after the accessory power supply of the vehicle is turned off, the main microcomputer 3, the shutdown signal control unit 24, and the transistor 42 set the main control signal input terminal 14 to a high level. This causes the shutdown terminal SHDN of the DC/DC converter 23 to be set to a low level and operation of the DC/DC converter 23 to be stopped.

In the data storage control device 1 configured as described above, when the delayed ACC is completed after the accessory power supply of the vehicle is turned off, the DC/DC converter 23 to supply power to the memory card 5 stops operating.

Thus, according to the data storage control device 1, the occurrence of a case in which, after the accessory power supply of the vehicle is turned off, operation of the DC/DC converter 23 affects other devices mounted in the vehicle can be inhibited.

Also, the data storage control device 1 includes the OR circuit 41 that outputs, to the DC/DC converter 23, the shutdown signal set to a high level to operate the DC/DC converter 23 or set to a low level to stop the DC/DC converter 23. The transistor 42 serves as a switch with one end coupled to the current path for the shutdown signal leading from the OR circuit 41 to the DC/DC converter 23 and the other end applied with a low level voltage. This makes it possible to change the shutdown signal from a high level to a low level by switching the transistor 42 from an off state to an on state.

Thus, by a simple method in which the transistor 42 is switched from an off state to an on state, operation of the DC/DC converter 23 can be stopped.

In the data storage control device 1, the shutdown signal control unit 24 includes the transistor 31. The transistor 31 has one end coupled to the second input terminal of the OR circuit 41 and the other end applied with a low-level voltage. This makes it possible to set the second input terminal of the OR circuit 41 to a low level by switching the transistor 31 from an off state to an on state.

The OR circuit 41 outputs a low-level shutdown signal only when the first input terminal and the second input terminal are both set to a low level. This inhibits the occurrence of a case in which, even when the second input terminal of the OR circuit 41 is set to a low level by the transistor 31 causing the first input terminal of the OR circuit 41 to be also set to a low level, the OR circuit 41 cannot output a low-level shutdown signal.

In the present embodiment, the first input terminal of the OR circuit 41 is coupled with the voltage output terminal Vout of the DC/DC converter 23. Therefore, when the transistor 42 sets the shutdown signal to a low level thereby stopping the operation of the DC/DC converter 23, the first input terminal of the OR circuit 41 is set to a low level. Furthermore, when the transistor 31 sets the second input terminal of the OR circuit 41 to a low level, the first input terminal and the second input terminal of the OR circuit 41 are both set to a low level. In this way, a low-level shutdown signal can be outputted from the OR circuit 41 after the operation of the DC/DC converter 23 is stopped.

In the embodiment described above: the DC/DC converter 23 is equivalent to an operating voltage generation circuit; the main microcomputer 3, the shutdown signal control unit 24, and the transistor 42 are equivalent to an operation stopping unit; the OR circuit 41 is equivalent to a control signal output circuit; the transistor 42 is equivalent to a first switch; and the transistor 31 is equivalent to a second switch.

An embodiment of the present disclosure has been described, but the present disclosure is not limited to the above-described embodiment and can take various forms within the technical scope of the present disclosure.

For example, even though, in the above embodiment, an SD card is used as a memory card, the memory card is not limited to an SD card. The memory card may be an alternative storage medium having a function to perform processing to prevent the data stored therein from being destroyed when the power supply therefor is shut down.

Also, in the above embodiment, when an interruption detection signal is inputted to the sub-microcomputer 4, the power supply for the main microcomputer 3 is turned off to forcibly shut down the main microcomputer 3. The output of the clock signal from the main microcomputer 3 may be stopped in an alternative manner. For example, when an interruption detection signal is inputted to the sub-microcomputer 4, a clock signal stopping signal for stopping the output of the clock signal may be outputted to the main microcomputer 3.

What is claimed is:

1. A data storage control device to control a memory card, the memory card including a non-volatile rewritable memory and operating using an external power supply, the data storage control device comprising:
   an operating voltage generation circuit generating, by having power supplied from a battery mounted in a vehicle, a card operating voltage to operate the memory card;
   an operation stopping unit stopping operation of the operating voltage generation circuit when a preset power supply stopping condition is met after an accessory power supply of the vehicle is turned off, the preset power supply stopping condition allowing the power supply to the memory card to be stopped; and
   a control signal output circuit outputting an operation control signal to the operating voltage generation circuit, the operation control signal having a preset first voltage level when operating the operating voltage generation circuit and having a second voltage level preset to be different from the first voltage level when stopping the operation of the operating voltage generation circuit;
   wherein the operation stopping unit includes a first switch having one end coupled to a current path of the operation control signal from the control signal output circuit to the operating voltage generation circuit and another end applied with the second voltage level; and
   wherein the first voltage level is a high level and the second voltage level is a low level,
   wherein the control signal output circuit includes an OR circuit having a first input terminal and a second input terminal, the OR circuit performing a logical OR operation between signals inputted to the first input terminal and the second input terminal, respectively, and outputting a result of the logical OR operation as the operation control signal, and
   wherein the operation stopping unit further includes a second switch having one end coupled to the second input terminal and another end applied with the second voltage level.

* * * * *